United States Patent
Lee

(10) Patent No.: US 8,710,891 B2
(45) Date of Patent: Apr. 29, 2014

(54) SEMICONDUCTOR IC INCLUDING PULSE GENERATION LOGIC CIRCUIT

(75) Inventor: Hoi Jin Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/613,501

(22) Filed: Sep. 13, 2012

(65) Prior Publication Data

US 2013/0214840 A1     Aug. 22, 2013

(30) Foreign Application Priority Data

Feb. 20, 2012 (KR) ........................ 10-2012-0016745

(51) Int. Cl.
*H03K 3/00*     (2006.01)
(52) U.S. Cl.
USPC .......................................... 327/291; 327/172
(58) Field of Classification Search
USPC ............... 327/34–35, 38, 172–176, 291, 293, 327/295–296
See application file for complete search history.

(56) References Cited

U.S. PATENT DOCUMENTS

| | | | | |
|---|---|---|---|---|
| 6,707,331 B1 * | 3/2004 | Nguyen | | 327/166 |
| 7,202,724 B2 | 4/2007 | Kim | | |
| 7,319,351 B2 * | 1/2008 | Zhang et al. | | 327/158 |
| 7,486,126 B2 * | 2/2009 | Shimazaki | | 327/295 |
| 7,843,243 B2 | 11/2010 | Kim | | |
| 8,054,119 B2 * | 11/2011 | Boerstler et al. | | 327/172 |
| 2005/0134342 A1 * | 6/2005 | Lin et al. | | 327/174 |

FOREIGN PATENT DOCUMENTS

| | | |
|---|---|---|
| JP | 11-017535 A | 1/1999 |
| JP | 2001267891 A | 9/2001 |

* cited by examiner

*Primary Examiner* — An Luu
(74) *Attorney, Agent, or Firm* — Volentine & Whitt, PLLC

(57) ABSTRACT

A pulse generation circuit includes storage elements disposed in a dispersed arrangement on a substrate and operating in response to a pulse signal, delay elements each proximate to a storage element receiving a clock signal and providing a delayed output signal, and a pulse generation logic circuit performing at least one logic operation on the clock signal and the plurality of delayed output signals to generate the pulse signal.

20 Claims, 9 Drawing Sheets

US 8,710,891 B2

SEMICONDUCTOR IC INCLUDING PULSE GENERATION LOGIC CIRCUIT

CROSS-REFERENCE TO RELATED APPLICATIONS

This application claims priority under 35 U.S.C. §119(a) from Korean Patent Application No. 10-2012-0016745 filed on Feb. 20, 2012, the subject matter of which is hereby incorporated by reference.

BACKGROUND

The inventive concept relates to semiconductor integrated circuits (ICs), and more particularly, to semiconductor ICs including a pulse generation circuit capable of stably adjusting a pulse width. The inventive concept also relates to apparatuses including this type of pulse generation circuit.

The master/slave flip-flop is widely used as a storage element within a broad class of digital circuits and systems. In certain digital systems demanding high-speed data processing, the pulsed flip-flop is commonly used. As suggested by its name, the pulsed flip-flip operates in response to a pulse signal. The contemporary pulsed flip-flop consumes relatively more current than the master/slave flip-flop.

Certain conventional pulse generation circuits include an inverter, a delay element connected to the inverter and providing an output signal, and an AND gate performing an AND operation with respect to a clock signal and the output signal to generate a pulse signal (or "pulse"). The "pulse width", or activation duration of the pulse, is largely determined by the amount of delay provided by the delay element. Thus, when process variation(s) occur during the fabrication of the delay element, the actual pulse width provided by the delay element may be narrower or wider than the intended (or "nominal") pulse width. Due to process related variations in the provided pulse width, the set-up time and/or hold time for conventional pulsed flip-flops may vary.

SUMMARY

In one embodiment, the inventive concept provides a pulse generation circuit for a semiconductor integrated circuit (IC), the pulse generation circuit comprising; a plurality of storage elements disposed in a dispersed arrangement on a substrate, wherein each storage element in the plurality of storage elements operates in response to a pulse signal, a plurality of delay elements, similarly disposed in the dispersed arrangement on the substrate, such that each delay element in the plurality of delay elements is proximate to a corresponding one of the plurality of storage elements, wherein each delay element receives a clock signal provides a delayed output signal, and a pulse generation logic circuit that receives the clock signal and a plurality of delayed output signals from the plurality of delay elements, and performs at least one logic operation on the clock signal and the plurality of delayed output signals to generate the pulse signal.

Each one of the plurality of delay elements may be an inverter chain including an odd numbered plurality of series-connected inverters, and each delayed output signal may be an inverted-delayed output signal.

The pulse generation logic circuit may include; an OR gate that performs an OR operation on the plurality of inverted-delayed output signals to generate an output signal, and an AND gate that performs an AND operation with respect to the clock signal and the output signal provided by the OR gate to generate the pulse signal.

The pulse generation logic circuit may include; a first AND gate that performs an AND operation on the plurality of inverted-delayed output signals to generate an output signal, and second AND gate that performs an AND operation with respect to the clock signal and the output signal provided by the first AND gate to generate the pulse signal.

The pulse generation logic circuit may include; a selection circuit that receives the plurality of inverted-delayed output signals and outputs a selected one of the plurality of inverted-delayed output signals in response to at least one selection signal, and an AND gate that performs an AND operation with respect to the clock signal and the selected one of the plurality of inverted-delayed output signals to generate the pulse signal.

The pulse generation logic circuit may include; a first AND gate that performs an AND operation with respect to a first group of the plurality of inverted-delayed output signals to provide a first output signal, an OR gate that performs an OR operation with respect to a second group of the plurality of inverted-delayed output signals to provide a second output signal, a selection circuit that selects one of the first output signal and the second output signal in response to at least one selection signal to provide an output signal, and a second AND gate that performs an AND operation with respect to the clock signal and the output signal provided by the selection circuit to generate the pulse signal.

In another embodiment, the inventive concept provides a data processing apparatus comprising; a data source, and a semiconductor integrated circuit (IC) that processes data provided by the data source, wherein the semiconductor IC includes a pulse generation circuit as noted above.

In another embodiment, the inventive concept provides a semiconductor integrated circuit (IC), comprising; a clock tree including a plurality of tree branches that distribute a clock signal and a plurality of pulse distribution networks, wherein at least one of the pulse distribution networks includes a pulse generation circuit. The pulse generation circuit comprises; a plurality of storage elements disposed in a dispersed arrangement on a substrate, wherein each storage element in the plurality of storage elements operates in response to a pulse signal, a plurality of delay elements, similarly disposed in the dispersed arrangement on the substrate, such that each delay element in the plurality of delay elements is proximate to a corresponding one of the plurality of storage elements, wherein each delay element receives a clock signal provides a delayed output signal, and a pulse generation logic circuit that receives the clock signal and a plurality of delayed output signals from the plurality of delay elements, and performs at least one logic operation on the clock signal and the plurality of delayed output signals to generate the pulse signal.

BRIEF DESCRIPTION OF THE DRAWINGS

Certain embodiments of the inventive concept will be described in some additional detail with reference to the accompanying drawings in which.

DETAILED DESCRIPTION

Despite the following description of certain illustrated embodiments, the inventive concept may be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
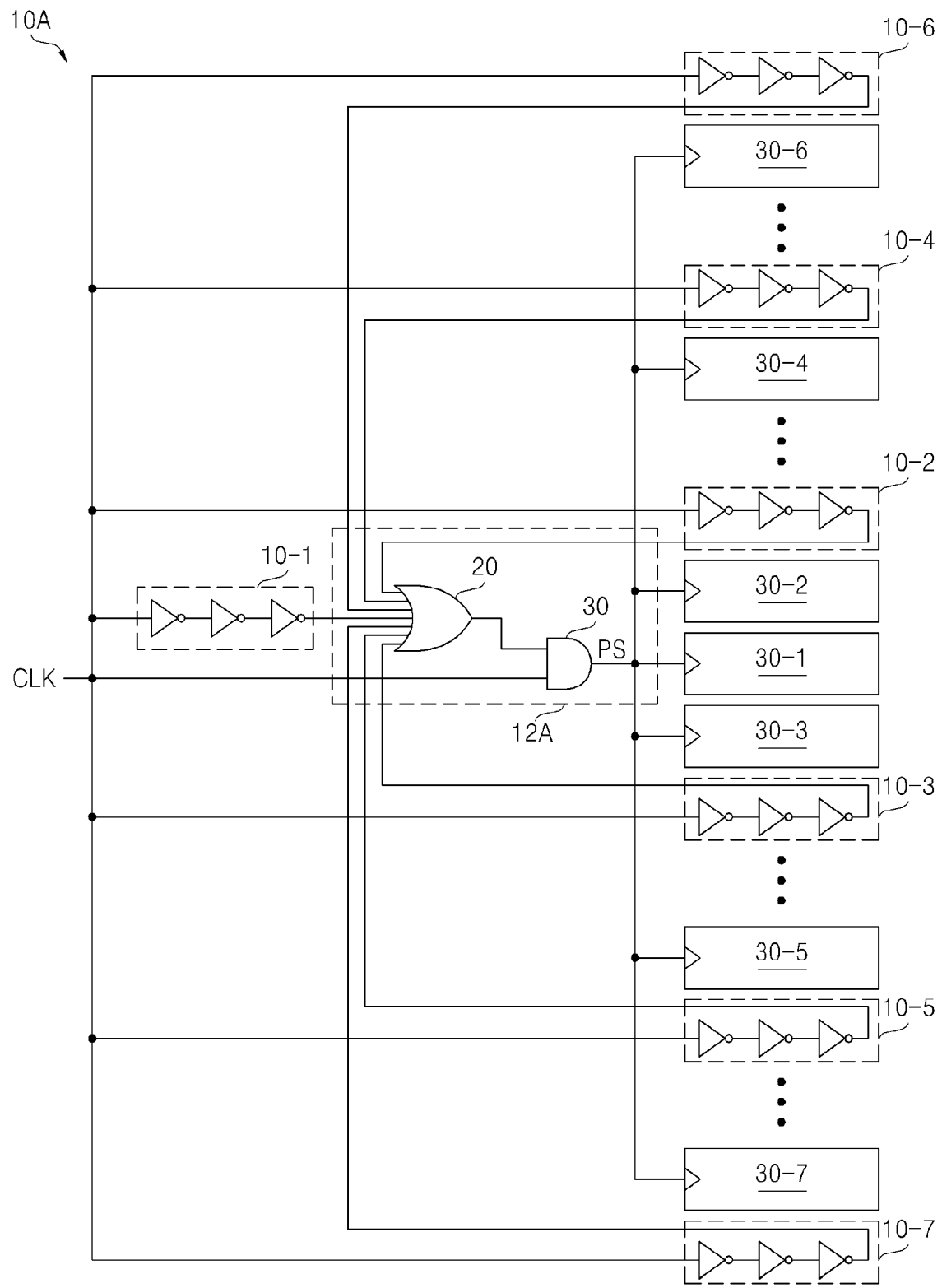
FIG. 1 is a partial block diagram illustrating in relevant part a semiconductor IC illustrating including a pulse generation circuit according to an embodiment of the inventive concept.

FIG. 1 is a partial block diagram illustrating in relevant part a semiconductor integrated circuit (IC) including a pulse generation circuit according to an embodiment of the inventive concept. Referring to FIG. 1, the IC 10A includes a pulse generation circuit and a plurality of storage elements 30-1 through 30-7.

The pulse generation circuit includes a plurality of delay elements, such as a plurality of series-connected inverter chains 10-1 through 10-7 and a pulse generation logic circuit 12A.

Each inverter chain 10-1 through 10-7 receives a clock signal CLK as an input signal and provides a respective inverted-delayed clock signal as an output signal. In the illustrated example of FIG. 1, each inverter chain 10-1 through 10-7 includes an odd-number of series-connected inverters.

The pulse generation logic circuit 12A performs a logic operation with respect to a plurality of inverted-delayed clock signals provided by the plurality of inverter chains 10-1 through 10-7 to generate a pulse signal PS.

In the embodiment illustrated in FIG. 1, the pulse generation logic circuit 12A includes a first logic gate (an OR gate) 20, and a second logic (an AND gate) 30. The OR gate 20 receives the plurality of inverted-delayed clock signals and provides an activated ORed output signal, so long as at least one of the plurality of inverted-delayed clock signals is activated. (In this regard, an "activated" signal may be defined as having a logically "high" level or a logically "low" level). The AND gate 30 then performs a logical AND operation with respect to the clock signal and the ORed output signal to generate the pulse signal PS. That is, the pulse signal will be activated, so long as both the clock signal and the ORed output signal are activated.

The pulse signal PS generated by the pulse generation circuit may then be provided to one or more of the storage elements 30-1 through 30-7. Thus, each of the storage elements 30-1 through 30-7 may operate (e.g.,) as a latch for corresponding input data in response to the pulse signal PS.

For example, each of the storage elements 30-1 through 30-7 may be a conventionally understood pulse sink including at least one of a resister, latch, flip-flop, or the like.

Each of the inverter chains 10-1 through 10-7 may be laid out according to a fabrication design of the IC 10A to be respectively adjacently to one of the plurality of storage elements 30-1 through 30-7. Hence, the plurality of inverter chains 10-1 through 10-7 will be spatially distributed over a constituent substrate of the IC 10A in a manner very similar to the distribution of the plurality of storage elements 30-1 through 30-7. In this manner, any process variation(s) associated with fabrication of particular portion(s) of the semiconductor substrate will commonly affect both the plurality of inverter chains 10-1 through 10-7 and the plurality of storage elements 30-1 through 30-7. Hence, the plurality of inverter chains 10-1 through 10-7 may serve as a monitor or sensing element for process variation(s) during the fabrication of the respective storage elements 30-1 through 30-7.

As shown in FIG. 1, a first storage element 30-1 is disposed closest to the pulse generation circuit while the sixth and seventh storage element 30-6 and 30-7 are disposed farthest from the pulse generation circuit. Yet, the first storage element 30-1 and corresponding first inverter chain 10-1 are disposed adjacent (or proximate) to one another. So, process, voltage, and/or temperature (hereafter, singularly or collectively "PVT") variation(s) associated with the fabrication and/or operation of the first storage element 30-1 will be similarly reflected in the output signal provided by the first inverter chain 10-1. Likewise, the sixth storage element 30-6 and corresponding sixth inverter chain 10-6 are disposed adjacent (or proximate) to one another. So, PVT variation(s) associated with the fabrication and/or operation of the sixth storage element 30-6 will be similarly reflected in the output signal provided by the sixth inverter chain 10-6.

The delay elements (e.g., the plurality of inverter chains 10-1 through 10-7) and the respectively corresponding plurality of storage elements 30-1 through 30-7 described above in relation to FIG. 1 may be incorporated within other embodiments of the inventive concept, such will be described in relation to FIGS. 2, 3 and 4 hereafter. However, embodiments of the inventive concept are not limited to only these examples. Rather, those skilled in the art will recognize that many different types and configurations of delay elements and/or storage elements may be used. For example, a circuit designer may determine the type, nature, disposition and arrangement of delay elements and corresponding storage elements.

However, the embodiments of FIGS. 1-4 illustrate an arrangement of multiple storage elements 30-1~30-7 with a single pulse generation circuit referred to as "cluster flip-flops". The path transmitting a clock signal CLK through a delay element (through an inverter chain) may be referred to as a "forward path", while the path transmitting an inverted-delayed clock signal from a delay element to the pulse generation circuit may be referred to as a backward path.

Figure 2:
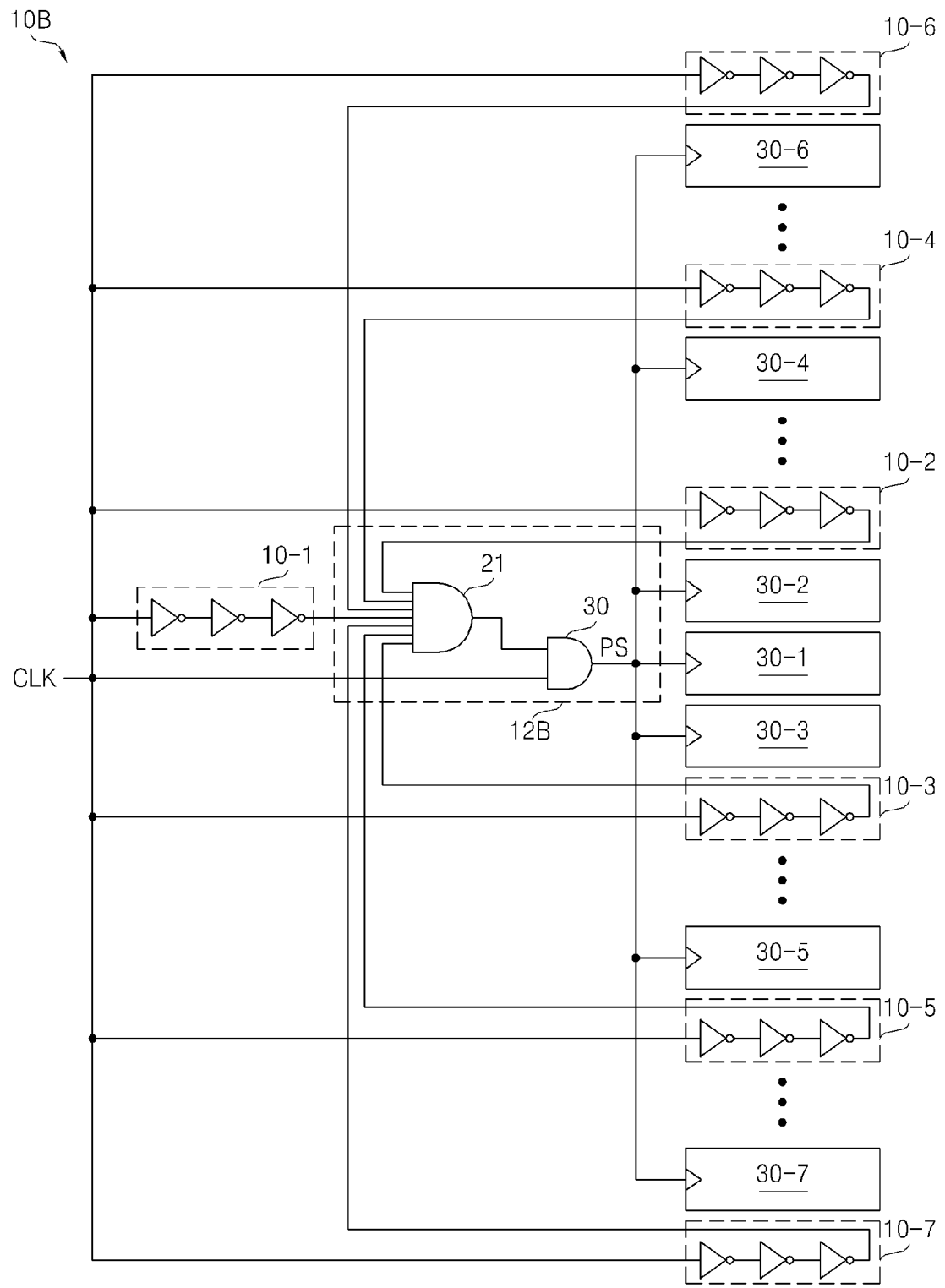
FIG. 2 is a partial block diagram illustrating in relevant part a semiconductor IC illustrating including a pulse generation circuit according to another embodiment of the inventive concept.

FIG. 2 is a partial block diagram illustrating in relevant part a semiconductor integrated circuit (IC) including a pulse generation circuit according to another embodiment of the inventive concept. Referring to FIG. 2, a semiconductor IC 10B includes the plurality of storage elements 30-1 through 30-7 previously described, and a pulse generation circuit. Here again, the pulse generation circuit is assumed to include as delay elements the plurality of inverter chains 10-1 through 10-7 previously described, as well as a pulse generation logic circuit 12B.

Except for the pulse generation logic circuit 12B, the structure and the operation of the semiconductor IC 10A of FIG. 1 and the structure and the operation of the semiconductor IC 10B are substantially same. Accordingly, repetitive descriptions of common elements and functions will not be given.

However, the pulse generation logic circuit 12B performs a different logic operation with respect to the plurality of inverted-delayed output signals received from the plurality of inverter chains 10-1 through 10-7. That is, the plurality of inverted-delayed clock signals are ANDed to generate a pulse signal PS using an AND gate 21, instead of the OG gate 20 of FIG. 1.

Figure 3:
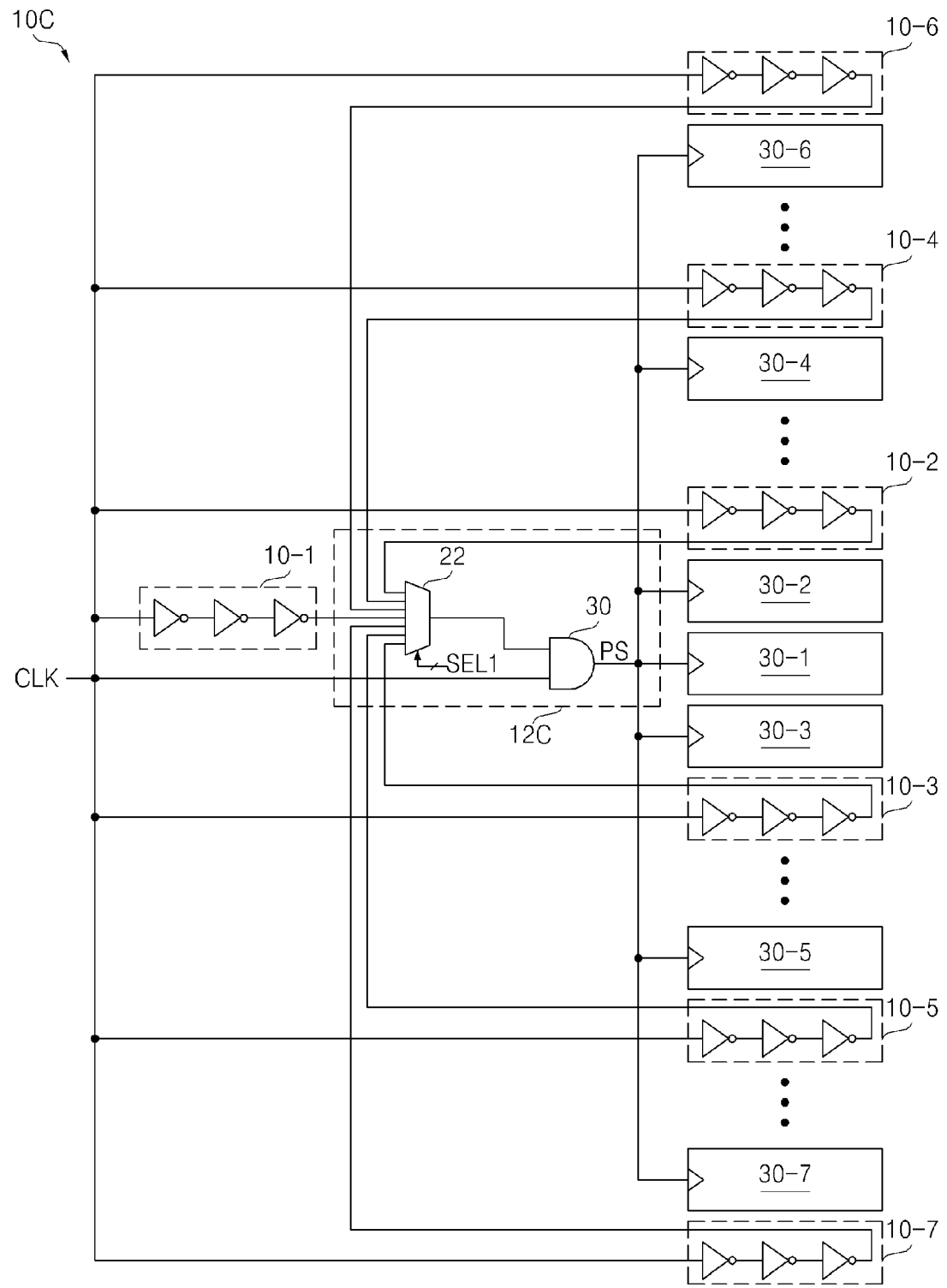
FIG. 3 is a partial block diagram illustrating in relevant part a semiconductor IC illustrating including a pulse generation circuit according to yet another embodiment of the inventive concept.

FIG. 3 is a partial block diagram illustrating in relevant part a semiconductor integrated circuit (IC) including a pulse generation circuit according to yet another embodiment of the inventive concept. Referring to FIG. 3, a semiconductor IC 10C includes the plurality of storage elements 30-1 through 30-7 previously described, and a pulse generation circuit. Here again, the pulse generation circuit is assumed to include as delay elements the plurality of inverter chains 10-1 through 10-7 previously described, as well as a pulse generation logic circuit 12C.

Except for the pulse generation logic circuit 12C, the structure and operation of the semiconductor IC 10C of FIG. 3 is substantially same as the structure and operation of the semiconductor IC 10A of FIG. 1 and the semiconductor IC 10B of FIG. 2.

The pulse generation logic circuit 12C includes a selection circuit 22 and an AND gate 30. The selection circuit 22 may be used to transmit any one of the plurality of inverted-delayed output signals provided by one of the plurality of inverter chains 10-1 through 10-7 to the AND gate 30 in response to at least one selection signal SEL1. Then, the AND gate 30 performs an AND operation with respect to a clock signal CLK and the output signal provided by the selection circuit 22 to generate the pulse signal PS.

Figure 4:
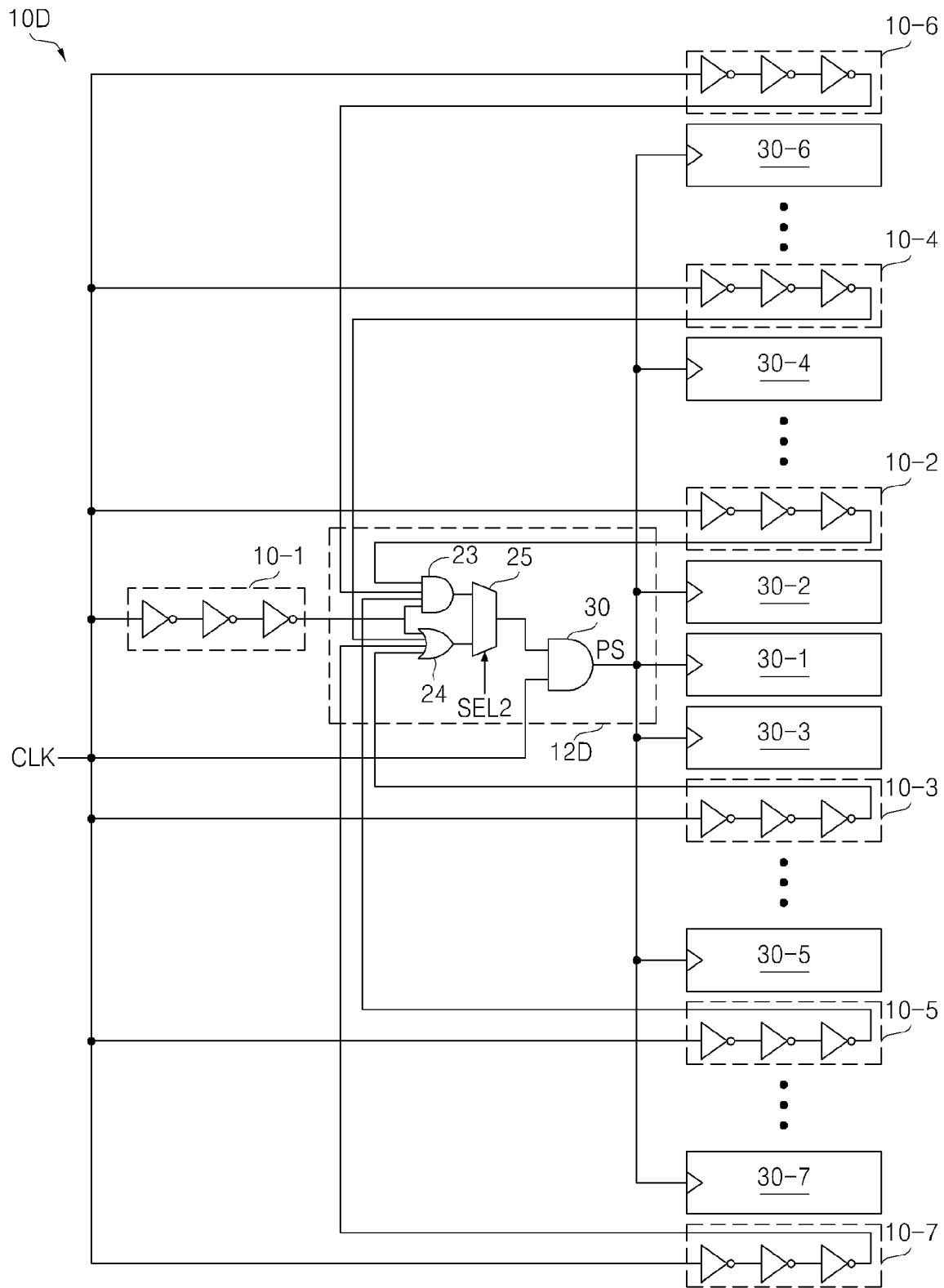
FIG. 4 is a partial block diagram illustrating in relevant part a semiconductor IC illustrating including a pulse generation circuit according to still another embodiment of the inventive concept.

FIG. 4 is a partial block diagram illustrating in relevant part a semiconductor integrated circuit (IC) including a pulse generation circuit according to still another embodiment of the inventive concept. Referring to FIG. 4, a semiconductor IC 10D includes the plurality of storage elements 30-1 through 30-7 previously described, and a pulse generation circuit. Here again, the pulse generation circuit is assumed to include as delay elements the plurality of inverter chains 10-1 through 10-7 previously described, as well as a pulse generation logic circuit 12D.

Except for the pulse generation logic circuit 12D, the structure and operation of the semiconductor IC 10D of FIG. 4 is substantially same as the structure and operation of the semiconductor IC 10A of FIG. 1, the semiconductor IC 10B of FIG. 2, and the semiconductor IC 10C of FIG. 3.

The pulse generation logic circuit 12D includes a first AND gate 23, an OR gate 24, a selection circuit 25, and a second AND gate 30.

The first AND gate 23 receives a first group of the inverted-delayed output signals from a first group of the plurality of inverter chains (e.g., 10-1, 10-2, 10-5, and 10-6) and performs an AND operation. The OR gate 24 receives a second group of the inverted-delayed output signals from a second group of the plurality of group inverter chains (e.g., 10-1, 10-3, 10-4, and 10-7) and performs an OR operation.

The selection circuit 25 receive a first output signal from the first AND gate 23 and a second output signal from the OR gate 24 and selects one of these output signals in response to at least one selection signal SEL2. The second AND gate 30 performs an AND operation with respect to a clock signal CLK and an output signal of the selection circuit 25 to generate the pulse signal PS.

In the illustrated embodiment of FIG. 4, an inverted-delayed output signal provided by the first inverter chain 10-1 is applied to both the first AND gate 23 and OR gate 24. Alternately, the inverted-delayed output signal provided by the first inverter chain 10-1 may be provided to one of the first AND gate 23 and OR gate 24.

Figure 5:
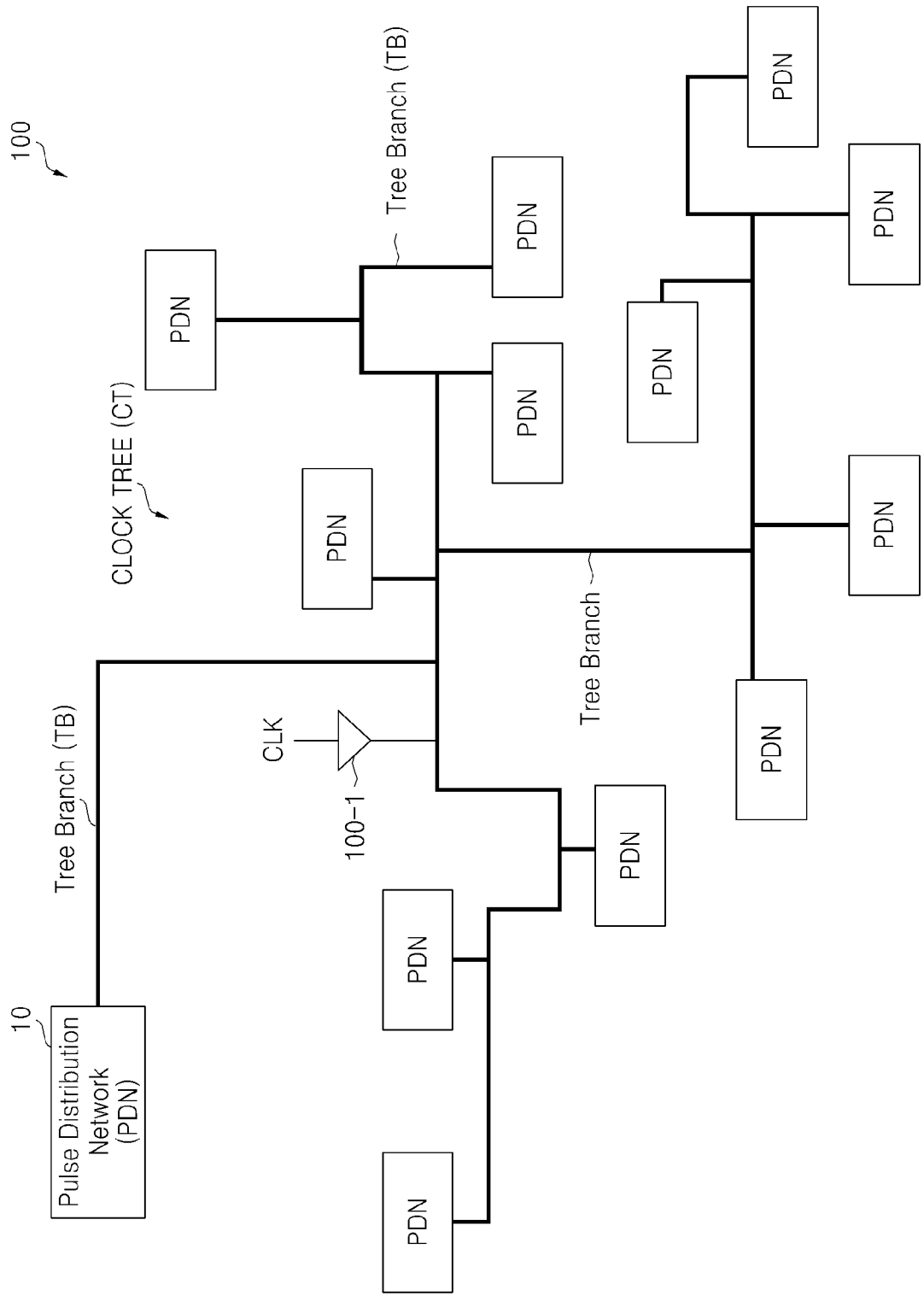
FIG. 5 is a block diagram generally illustrating in one embodiment a pulse distribution network that may incorporate one or more of the pulse generation circuits described in relation to FIGS. 1, 2, 3, and/or 4.

FIG. 5 is a block diagram illustrating in one embodiment a semiconductor IC including a pulse distribution network including the pulse generation circuit described in relation to FIGS. 1, 2, 3, and/or 4.

Referring to FIG. 5, a semiconductor IC 100 comprises a clock tree (CT) including a plurality of tree branches (TBs) for distributing a clock signal (CLK) and a plurality of pulse distribution networks (PDNs) 10.

Each of the PDNs 10 includes the pulse generation circuit included in the IC 10A, 10B, 10C or 10D (collectively referred to as 10) explained referring to FIGS. 1 through 4 and a plurality of storage elements 30-1~30-7.

The semiconductor IC 100 further include at least one clock buffer 100-1 buffering a clock signal CLK output from a phase locked loop (PLL) and transmitting the buffered clock signal into the clock tree CT.

The clock tree CT may transmit the clock signal CLK, that is, the buffered clock signal, into a plurality of tree branches TBs. Hereinafter, the clock signal CLK may be a clock signal and/or the buffered clock signal for convenience of explanation. For example, the clock tree CT may be referred to as a clock distribution network.

Each PDN 10 may generate a pulse signal PS by using the clock signal CLK transmitted through a corresponding tree branch TB among the tree branches TBs.

As described referring to FIGS. 1 through 4, the pulse signal PS generated from the pulse generation circuit of each PND 10 may be provided to each of the storage elements 30-1~30-7 embodied in each PND 10. Thus, each of the storage elements 30-1~30-7 may latch a corresponding input data in response to the pulse signal PS. At this time, the tree branch TB may denote a clock path capable of transmitting the clock signal CLK into the pulse generation circuit of each PND 10.

Figure 6:
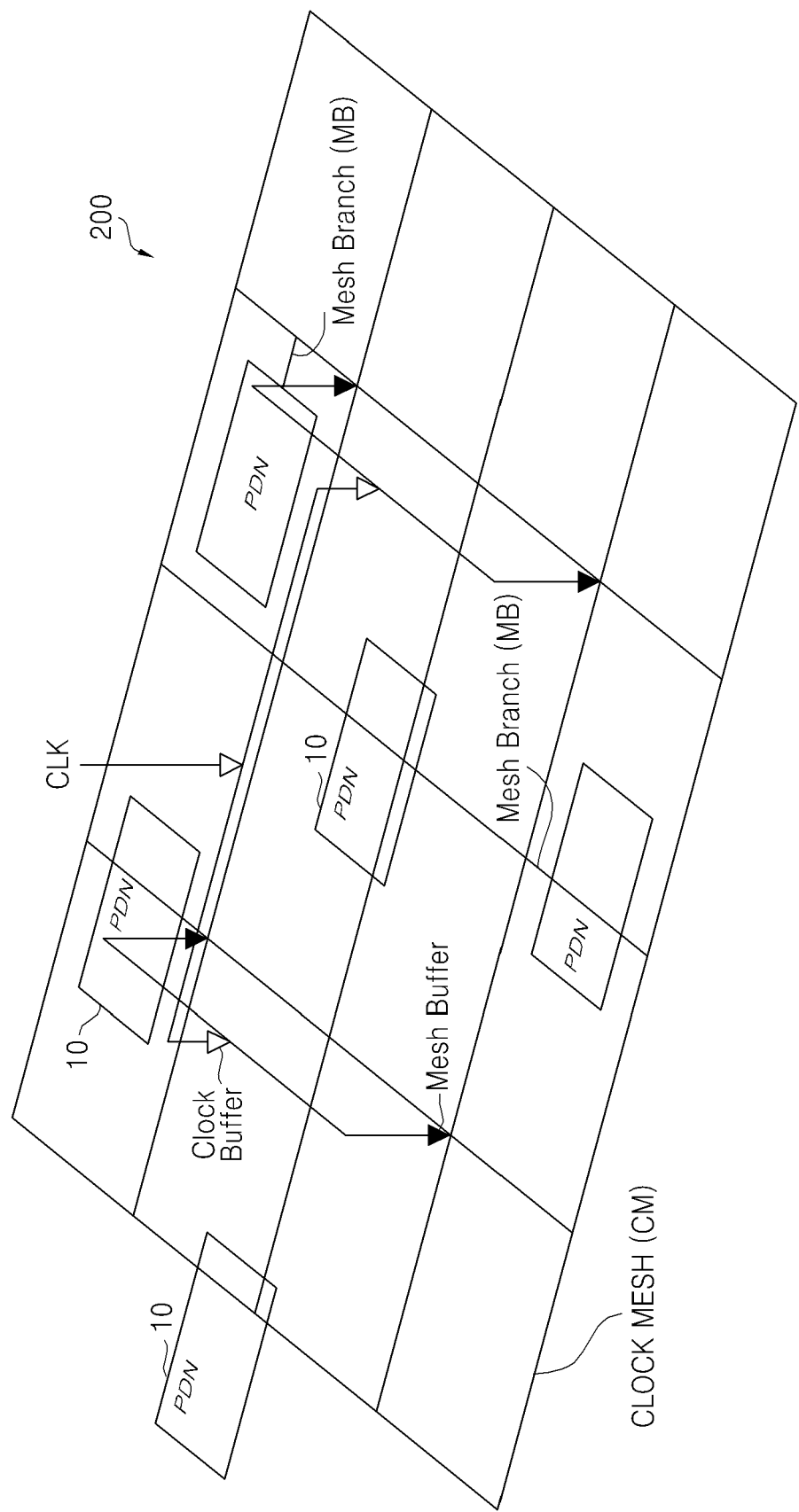
FIG. 6 is a block diagram generally illustrating in another embodiment a pulse distribution network that may incorporate one or more of the pulse generation circuits described in relation to FIGS. 1, 2, 3, and/or 4.

FIG. 6 is a block diagram illustrating in another embodiment, a semiconductor IC including a pulse distribution network including one or more pulse generation circuits such as those described in relation to FIGS. 1, 2, 3, and/or 4. Referring to FIGS. 5 and 6, the tree structure of FIG. 5 for transmitting the clock signal CLK is changed into the mesh structure.

Referring to FIG. 6, a semiconductor IC 200 includes a clock mesh CM including a plurality of mesh branches MBs for distributing a clock signal CLK and a plurality of pulse distribution networks PDN 10. For example, a mesh may denote a uniform rectangular grid of wires or patterns.

The semiconductor IC 200 further includes at least one mesh buffer buffering a clock signal CLK output from a clock source, for example, a PLL, transmitting the buffered clock signal into a clock mesh CM and a clock buffer for transmitting the clock signal CLK into the at least one of the mesh buffer. The clock mesh CM transmits the clock signal CLK, that is, the buffered clock signal, into the mesh branches MBs.

Each pulse generation circuit of each PND 10 generates a pulse signal PS by using the clocks signal CLK transmitted through the corresponding mesh branch MB among the mesh branches MBs.

As described with reference to FIGS. 1 through 4, the pulse signal PS generated through the pulse generation circuit of each PDN 10 may be provided into the storage elements 30-1~30-7 embodied in each PDN 10. Thus, each of the storage elements 30-1~30-7 may latch a corresponding input data in response to the pulse signal PS. Here, the mesh branch MB may denote a clock path capable of transmitting the clock signal CLK into the pulse generation circuit.

Figure 7:
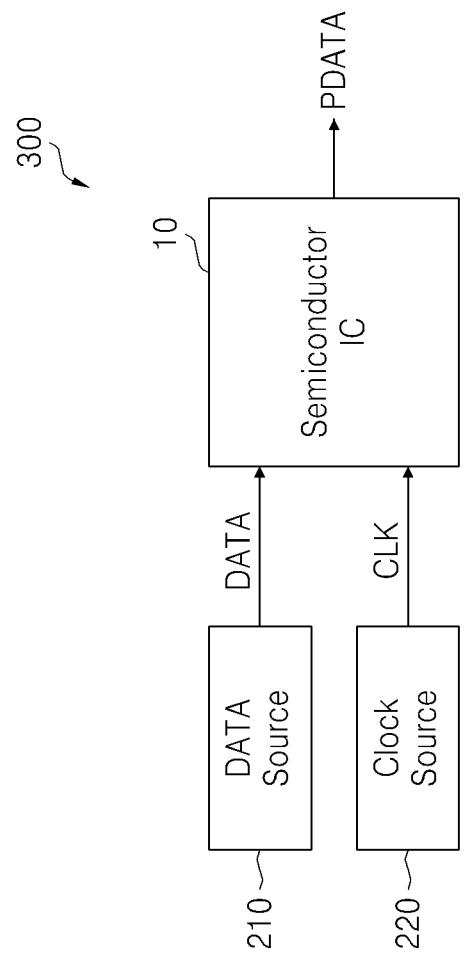
FIG. 7 is a general block diagram illustrating a data processing apparatus that may include one or more of the pulse generation circuits described in relation to FIGS. 1, 2, 3, and/or 4.

FIG. 7 is a general block diagram illustrating in one embodiment a data processing apparatus including one or more pulse generation circuits such as those described in relation to FIGS. 1, 2, 3, and/or 4.

A data processing apparatus 300 includes a semiconductor IC 10, a data source 210, and a clock source 220. In certain embodiments, the data source 210 and/or the clock source 220 may be integrated in the semiconductor IC 10.

The semiconductor IC 10 includes the pulse generation circuit and the plurality of storage elements 30-1~30-7 described referring to FIGS. 1 through 4.

The data processing apparatus 300 denotes all kinds of data processing apparatuses capable of processing data output from the data source 210 in response to the pulse signal PS generated by the pulse generation circuit described referring to FIGS. 1 through 4. For example, the data processing apparatus 300 may denote system-on chip (SoC), processor, central processing unit (CPU), personal computer (PC), data server, or portable device.

The portable device may be embodied into a laptop computer, mobile phone, smart phone, tablet PC, personal digital assistant (PDA), enterprise digital assistant (EDA), digital still camera, digital video camera, portable multimedia player (PMP), personal navigation device or portable navigation device (PND), car navigation system, handheld game console, or handheld device such as e-book.

Figure 8:
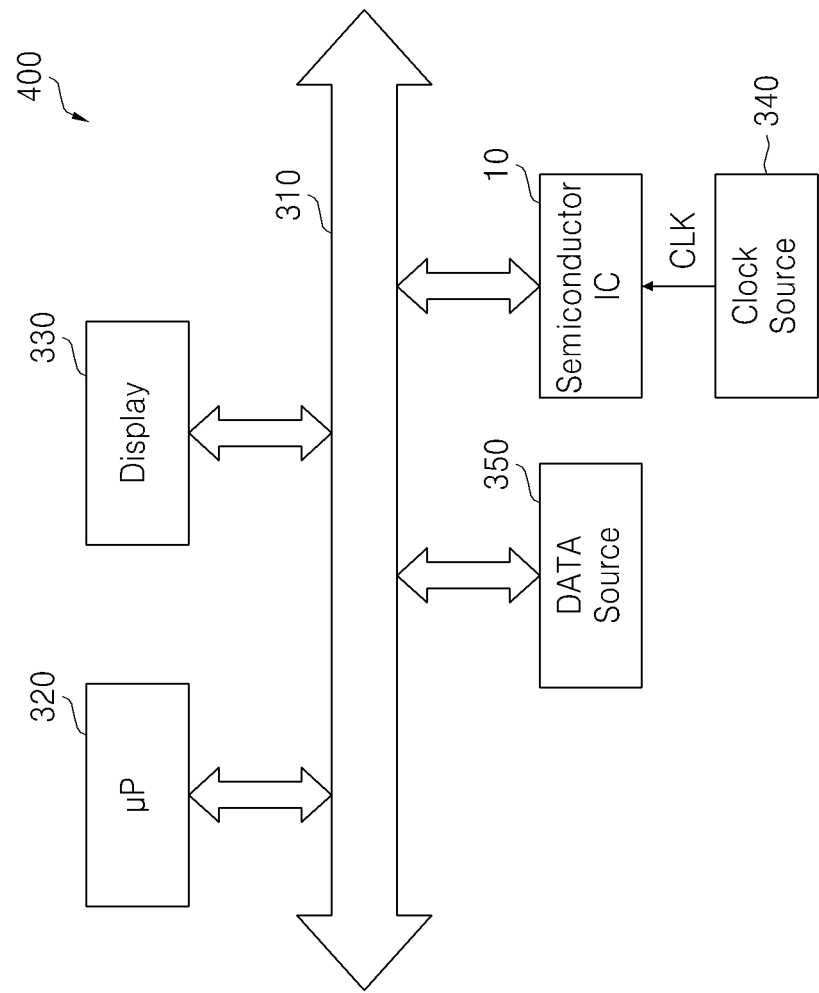
FIG. 8 is a block diagram illustrating another data processing apparatus that may include one or more of the pulse generation circuits described in relation to FIGS. 1, 2, 3, and/or 4.

FIG. 8 is a block diagram illustrating in another embodiment a data processing apparatus including one or more pulse generation circuits such as those described in relation to FIGS. 1, 2, 3, and/or 4. Referring to FIG. 8, a data processing apparatus 400 includes the semiconductor IC 10, a microprocessor 320, a display 330, and a data source 350 communicating with each other through a bus 310.

The data source 350 performing an identical function to the data source 210 of FIG. 7 may be an internal memory or external memory. Also, the data processing apparatus 400 further includes a clock source 340 generating a clock signal CLK. In some embodiments, the clock source 340 may be integrated or embedded in the semiconductor IC 10. And, the semiconductor IC 10 and the microprocessor 320 may be integrated into a single chip.

As described above, the data processing apparatus 400 may be embodied into personal computer (PC), server, or portable device.

Figure 9:
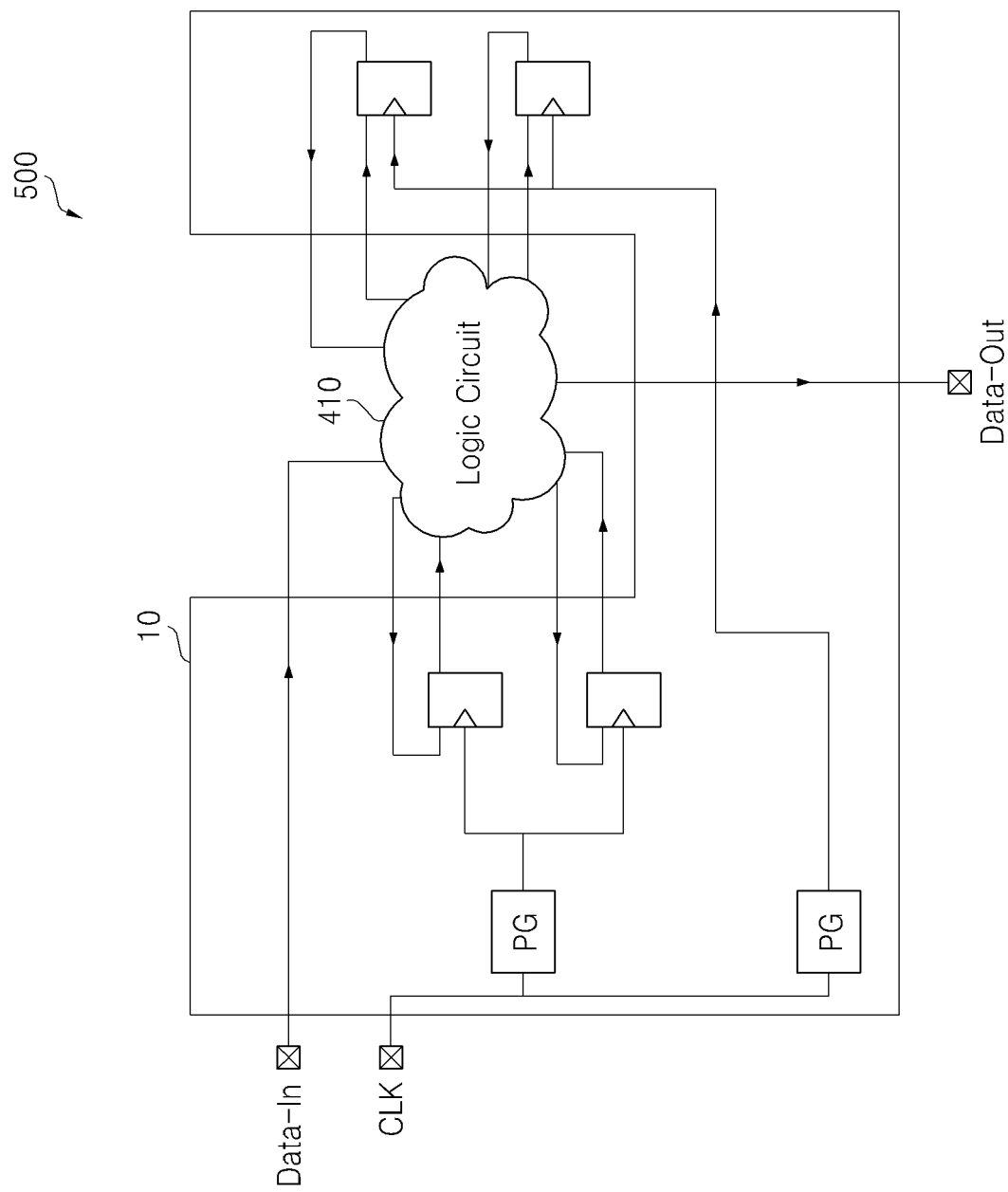
FIG. 9 is a block diagram illustrating yet another data processing apparatus that may include one or more of the pulse generation circuits described in relation to FIGS. 1, 2, 3, and/or 4.

FIG. 9 is a block diagram illustrating in another embodiment a data processing apparatus including one or more pulse generation circuit such as those described in relation to FIGS. 1, 2, 3, and/or 4. Referring to FIGS. 1, 2, 3, 4, and 9, a data processing apparatus 500 may be embodied into an integrated circuit or a SoC.

The data processing apparatus 500 includes a semiconductor IC 10 and a logic circuit 410. The logic circuit 410 may be embodied into a volatile memory or non-volatile memory. In some embodiments, the logic circuit 410 may include some of the storage elements. Each storing element embodied in the semiconductor IC 10 may exchange a data with the logic circuit 410 in response to the pulse signal PS. For example, an input data DATA-In is processed in the semiconductor IC 10 and the logic circuit 410 and output as an output data Data-Out.

In FIG. 9, the element "PG" denotes a pulse generation circuit such as those described in relation to FIGS. 1, 2, 3, and/or 4.

As described above, the pulse generation circuit according to an exemplary embodiment may adjust a pulse width of a pulse stably regardless spatial layout variation of data storage elements. Accordingly, the pulse generation circuit may adjust the set-up time and/or the hold time of the pulsed flip-flop.

While the inventive concept has been particularly shown and described with reference to exemplary embodiments thereof, it will be understood that various changes in form and details may be made therein without departing from the scope of the following claims.

What is claimed is:

1. A pulse generation circuit for a semiconductor integrated circuit (IC), the pulse generation circuit comprising:
    a plurality of storage elements disposed in a dispersed arrangement on a substrate, wherein each storage element in the plurality of storage elements operates in response to a same pulse signal;

a plurality of delay elements, wherein the plurality of delay elements are respectively located adjacent to different ones of the plurality of storage elements such that the plurality of delay elements are similarly disposed in the dispersed arrangement on the substrate, and wherein each delay element receives a clock signal and provides a delayed output signal; and a pulse generation logic circuit that receives the clock signal and the delayed output signal from each of the plurality of delay elements, and performs at least one logic operation on the clock signal and each received delayed output signal to generate the same pulse signal.

2. The pulse generation circuit of claim 1, wherein each one of the plurality of delay elements is an inverter chain including an odd numbered plurality of series-connected inverters, and each delayed output signal is an inverted-delayed output signal.

3. The pulse generation circuit of claim 2, wherein the pulse generation logic circuit comprises:
an OR gate that performs an OR operation on the plurality of inverted-delayed output signals to generate an output signal; and
an AND gate that performs an AND operation with respect to the clock signal and the output signal provided by the OR gate to generate the pulse signal.

4. The pulse generation circuit of claim 2, wherein the pulse generation logic circuit comprises:
a first AND gate that performs an AND operation on the plurality of inverted-delayed output signals to generate an output signal; and
a second AND gate that performs an AND operation with respect to the clock signal and the output signal provided by the first AND gate to generate the pulse signal.

5. The pulse generation circuit of claim 2, wherein the pulse generation logic circuit comprises:
a selection circuit that receives the plurality of inverted-delayed output signals and outputs a selected one of the plurality of inverted-delayed output signals in response to at least one selection signal; and
an AND gate that performs an AND operation with respect to the clock signal and the selected one of the plurality of inverted-delayed output signals to generate the pulse signal.

6. The pulse generation circuit of claim 2, wherein the pulse generation logic circuit comprises:
a first AND gate that performs an AND operation with respect to a first group of the plurality of inverted-delayed output signals to provide a first output signal;
an OR gate that performs an OR operation with respect to a second group of the plurality of inverted-delayed output signals to provide a second output signal;
a selection circuit that selects one of the first output signal and the second output signal in response to at least one selection signal to provide an output signal; and
a second AND gate that performs an AND operation with respect to the clock signal and the output signal provided by the selection circuit to generate the pulse signal.

7. The pulse generation circuit of claim 1, wherein each one of the plurality of storage elements is configured to store input data in response to the pulse signal.

8. The pulse generation circuit of claim 1, wherein the semiconductor IC is a processor.

9. A data processing apparatus comprising:
a data source; and
a semiconductor integrated circuit (IC) that processes data provided by the data source, wherein the semiconductor IC includes a pulse generation circuit, comprising:

a plurality of storage elements disposed in a dispersed arrangement on a substrate, wherein each storage element in the plurality of storage elements operates in response to a same pulse signal;
a plurality of delay elements, wherein the plurality of delay elements are respectively located adjacent to different ones of the plurality of storage elements such that the plurality of delay elements are similarly disposed in the dispersed arrangement on the substrate, and wherein each delay element receives a clock signal and provides a delayed output signal; and
a pulse generation logic circuit that receives the clock signal and the delayed output signal from each of the plurality of delay elements, and performs at least one logic operation on the clock signal and each received delayed output signal to generate the same pulse signal.

10. The data processing apparatus of claim 9, wherein each one of the plurality of delay elements is an inverter chain including an odd numbered plurality of series-connected inverters, and each delayed output signal is an inverted-delayed output signal.

11. The data processing apparatus of claim 10, wherein the pulse generation logic circuit comprises:
an OR gate that performs an OR operation on the plurality of inverted-delayed output signals to generate an output signal; and
an AND gate that performs an AND operation with respect to the clock signal and the output signal provided by the OR gate to generate the pulse signal.

12. The data processing apparatus of claim 10, wherein the pulse generation logic circuit comprises:
a first AND gate that performs an AND operation on the plurality of inverted-delayed output signals to generate an output signal; and
a second AND gate that performs an AND operation with respect to the clock signal and the output signal provided by the first AND gate to generate the pulse signal.

13. The data processing apparatus of claim 10, wherein the pulse generation logic circuit comprises:
a selection circuit that receives the plurality of inverted-delayed output signals and outputs a selected one of the plurality of inverted-delayed output signals in response to at least one selection signal; and
an AND gate that performs an AND operation with respect to the clock signal and the selected one of the plurality of inverted-delayed output signals to generate the pulse signal.

14. The data processing apparatus of claim 10, wherein the pulse generation logic circuit comprises:
a first AND gate that performs an AND operation with respect to a first group of the plurality of inverted-delayed output signals to provide a first output signal;
an OR gate that performs an OR operation with respect to a second group of the plurality of inverted-delayed output signals to provide a second output signal;
a selection circuit that selects one of the first output signal and the second output signal in response to at least one selection signal to provide an output signal; and
a second AND gate that performs an AND operation with respect to the clock signal and the output signal provided by the selection circuit to generate the pulse signal.

15. The data processing apparatus of claim 10, wherein each one of the plurality of storage elements is configured to store the data provided by the data source in response to the pulse signal.

16. The data processing apparatus of claim 10, wherein the semiconductor IC is a processor.

17. The data processing apparatus of claim 10, wherein the data processing apparatus is a system on chip (SoC) or a portable device.

18. A semiconductor integrated circuit (IC), comprising:
- a clock tree including a plurality of tree branches that distribute a clock signal and a plurality of pulse distribution networks, wherein at least one of the pulse distribution networks includes a pulse generation circuit, wherein the pulse generation circuit comprises:
- a plurality of storage elements disposed in a dispersed arrangement on a substrate, wherein each storage element in the plurality of storage elements operates in response to a same pulse signal;
- a plurality of delay elements, wherein the plurality of delay elements are respectively located adjacent to different ones of the plurality of storage elements such that the plurality of delay elements are similarly disposed in the dispersed arrangement on the substrate, and wherein each delay element receives a clock signal and provides a delayed output signal; and
- a pulse generation logic circuit that receives the clock signal and the delayed output signal from each of the plurality of delay elements, and performs at least one logic operation on the clock signal and each received delayed output signal to generate the same pulse signal.

19. The semiconductor IC of claim 18, further comprising: at least one clock buffer that buffers the clock signal, such that the clock signal distributed by the clock tree is a buffer clock signal.

20. The semiconductor IC of claim 19, wherein each one of the plurality of delay elements is an inverter chain including an odd numbered plurality of series-connected inverters, and each delayed output signal is an inverted-delayed output signal.

* * * * *